(12) United States Patent
Kasue et al.

(10) Patent No.: US 7,022,554 B2
(45) Date of Patent: Apr. 4, 2006

(54) METHOD FOR FABRICATING CIRCUIT MODULE

(75) Inventors: Kazuo Kasue, Kyoto (JP); Takehisa Kajikawa, Nishinomiya (JP); Satoru Hachinohe, Yokaichi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 46 days.

(21) Appl. No.: 10/705,823

(22) Filed: Nov. 13, 2003

(65) Prior Publication Data

US 2004/0097095 A1     May 20, 2004

(30) Foreign Application Priority Data

Nov. 14, 2002   (JP) .............................. 2002-330686
Sep. 18, 2003   (JP) .............................. 2003-326638

(51) Int. Cl.
 *H01L 21/44*   (2006.01)
 *H01L 21/48*   (2006.01)
 *H01L 21/50*   (2006.01)

(52) U.S. Cl. ..................................... 438/126
(58) Field of Classification Search ................ 438/124, 438/126, 127
See application file for complete search history.

(56) References Cited

U.S. PATENT DOCUMENTS

| | | | | |
|---|---|---|---|---|
| 5,120,678 A | * | 6/1992 | Moore et al. .................. 29/840 |
| 5,766,982 A | * | 6/1998 | Akram et al. .................. 438/51 |
| 5,817,542 A | * | 10/1998 | Sakemi ....................... 438/108 |
| 5,821,456 A | * | 10/1998 | Wille et al. ................. 174/52.2 |
| 5,866,442 A | * | 2/1999 | Brand ........................ 438/108 |
| 5,998,242 A | * | 12/1999 | Kirkpatrick et al. ......... 438/127 |
| 6,124,643 A | * | 9/2000 | Brand ........................ 257/787 |
| 6,207,475 B1 | * | 3/2001 | Lin et al. .................... 438/108 |
| 6,228,680 B1 | * | 5/2001 | Thomas ...................... 438/108 |
| 6,376,278 B1 | * | 4/2002 | Egawa et al. ............... 438/110 |
| 6,391,682 B1 | * | 5/2002 | Tsai et al. ................... 438/108 |
| 6,391,683 B1 | * | 5/2002 | Chiu et al. .................. 438/108 |
| 6,391,762 B1 | * | 5/2002 | Gamota et al. ............. 438/618 |
| 6,475,828 B1 | * | 11/2002 | Hoang ....................... 438/108 |
| 6,498,054 B1 | * | 12/2002 | Chiu et al. .................. 438/108 |
| 6,610,559 B1 | * | 8/2003 | Wang et al. ................. 438/108 |
| 6,632,690 B1 | * | 10/2003 | Master et al. ................ 438/15 |
| 6,724,091 B1 | * | 4/2004 | Jayaraman et al. ......... 257/778 |
| 6,727,119 B1 | * | 4/2004 | Saitou ........................ 438/127 |

FOREIGN PATENT DOCUMENTS

JP   08-241900   9/1996
JP   08-306717   11/1996

* cited by examiner

*Primary Examiner*—David A. Zarneke
(74) *Attorney, Agent, or Firm*—Keating & Bennett, LLP

(57) ABSTRACT

A method for fabricating a circuit module includes a step of filling the gap between a chip component and a substrate on which the chip component is mounted in a flip chip configuration with resin. The method uses simplified equipment and minimizes the undesired spread of resin. The resin is supplied between the sidewall of a dispenser needle and the sidewall of the chip component. Due to capillary action, a resin pool is formed and then the gap between the chip component and the substrate is spontaneously filled with the resin of the resin pool.

20 Claims, 2 Drawing Sheets

METHOD FOR FABRICATING CIRCUIT MODULE

BACKGROUND OF THE INVENTION

1. Field of the Invention

The present invention relates to a method for fabricating a circuit module that includes a substrate on which a chip component, such as a semiconductor chip, is mounted in a flip chip configuration, and more particularly, to a method for filling the gap between a substrate and a chip component with resin in a flip chip package.

2. Description of the Related Art

In flip chip package technology, in order to prevent stress on electrode bumps caused by a difference in thermal expansion coefficient between a substrate and a chip component mounted on the substrate, it is necessary to fill the gap between the substrate and the chip component in a flip chip configuration.

Resin may be applied on the entire surface of the substrate. However, if a component is incapable of operating properly when it is in contact with resin is mounted on the substrate, it is necessary to fill only the gap between the chip component and the substrate with resin.

One example of such a technique is disclosed in Japanese Unexamined Patent Application Publication No. 8-241900 which will now be briefly described with reference to FIGS. 2A to 2D. FIG. 2A illustrates a flip chip package where a chip component 2 is mounted on a substrate 1 with electrode bumps 3 disposed therebetween. As shown in FIG. 2B, a resin 6 is partially applied to the flip chip package. As shown in FIG. 2C, the resultant flip chip package is encased in a hermetically sealed enclosure 8. As shown in FIG. 2D, a pedestal 4 that is equipped with a built-in heat source heats the resin 6 while a decompressor 9 reduces the pressure inside the enclosure 8, thereby generating airflow. This airflow fills the gap between the chip component 2 and the substrate 1 with the resin 6.

Unfortunately, the technique disclosed in Japanese Unexamined Patent Application Publication No. 8-241900 has several drawbacks. That is, the technique is labor intensive since the enclosure 8 must be hermetically sealed and depressurized. Moreover, since the technique requires the decompressor 9, larger manufacturing equipment is necessary, which results in increased manufacturing costs.

Furthermore, the current trend for miniaturization of circuit modules requires a higher packing density of components on a substrate. Thus, a technique in which resin does not widely spread outside the chip components is required. Moreover, in a circuit used in a higher frequency region, if resin with a low quality factor widely spreads over the substrate, the circuit module deteriorates. Thus, the undesired spread of resin on the substrate is also a problem.

SUMMARY OF THE INVENTION

To overcome the problems described above, preferred embodiments of the present invention provide a method for fabricating a circuit module, whereby the gap between a chip component and a substrate is filled with resin using simplified equipment such that the undesired spread of the resin on the substrate is prevented.

According to a first preferred embodiment of the present invention, a method for fabricating a circuit module includes the steps of supplying a resin from a dispenser needle onto a substrate on which a chip component is mounted in a flip chip configuration so as to form a resin pool between a sidewall of the chip component and a sidewall of a dispenser needle, and spontaneously filling a gap between the chip component and the substrate with the resin of the resin pool.

The resin pool is preferably formed between the sidewall of the chip component and the sidewall of the dispenser needle, and the gap between the chip component and the substrate is spontaneously filled with resin of the resin pool such that the dispenser needle prevents the resin from being spread beyond the dispenser needle in the opposite direction away from the chip component, and thus, the undesired spread of resin on the substrate is prevented. Accordingly, the chip component requires only a small area on the substrate, thereby increasing the packing density of components on the substrate. Furthermore, after the resin pool is formed, the dispenser needle stops supplying resin and the gap between the chip component and the substrate is spontaneously filled with the resin of the resin pool. Thus, the dispenser needle does not require a supply of resin for a long period of time which simplifies the operation of the dispenser needle. Furthermore, resin is supplied with greatly simplified equipment without the necessity of a decompressor, leading to greatly reduced manufacturing costs.

According to a second preferred embodiment of the present invention, a method for fabricating a circuit module includes the steps of placing a substrate on a pedestal having a built-in heat source to heat the substrate, the substrate including a chip component that is mounted thereon in a flip chip configuration, supplying a resin onto the substrate by a dispenser needle to form a resin pool between a sidewall of the chip component and a sidewall of the dispenser needle, and spontaneously filling the gap between the chip component and the substrate with the resin constituting the resin pool.

It is preferred that the substrate is heated during this process because heating the substrate reduces the viscosity of the resin supplied on the substrate, thereby accelerating the rate of filling the gap between the chip component and the substrate with the resin.

Preferably, in the first and second preferred embodiments of the present invention, the rate at which the resin pool is formed between the sidewall of the chip component and the sidewall of the dispenser needle due to capillary action is greater than the rate at which the gap between the chip component and the substrate is filled with the resin.

Due to capillary action, the resin supplied by the dispenser needle forms the resin pool between the sidewall of the chip component and the sidewall of the dispenser needle and spontaneously fills the gap between the chip component and the substrate. The rate at which the resin pool is formed between the sidewall of the chip component and the sidewall of the dispenser needle due to capillary action is greater than the rate at which the gap between the chip component and the substrate is filled with the resin whereby the resin pool is immediately formed.

Preferably, the dispenser needle is fixed at the same location until the gap is filled with the resin of the resin pool in the step of spontaneously filling the gap between the chip component and the substrate with the resin constituting the resin pool.

Since the dispenser needle is fixed, the gap is immediately filled with the resin of the resin pool, thereby preventing the undesired spread of the resin in the opposite direction away from the chip component. Accordingly, the packing density of components on the substrate is increased.

Preferably, in forming the resin pool, the distance between the sidewall of the chip component and the sidewall of the dispenser needle is preferably less than about 0.15 mm.

The distance between the sidewall of the chip component and the sidewall of the dispenser needle is preferably less than about 0.15 mm, thereby facilitating the formation of the resin pool between the sidewall of the chip component and the sidewall of the dispenser needle.

Preferably, the chip component is a bare chip. When a bare chip is mounted on a substrate in a flip chip configuration, to protect the bare chip, the gap between the bare chip and the substrate must be filled with resin. With the preferred embodiments of the present invention, the gap is filled with resin using greatly simplified equipment.

In the first and second preferred embodiments of the present invention, the circuit module preferably includes a radio frequency circuit. Although radio frequency circuits require high quality factors, resin generally used for filling gaps has a low quality factor as described above. Thus, in the radio frequency circuits, prevention of the undesired spread of resin on the substrate is required. Thus, the present invention is effectively applied to the radio frequency circuits.

Preferably, the resin is an epoxy resin. The epoxy resin exhibits high electrical insulation, adhesiveness and heat resistance when it is cured. The epoxy resins are preferable to fill the gap between the chip component and the substrate.

Preferably, the sidewall of the dispenser needle is coated with a water repellant material. The sidewall of the dispenser needle coated with the water repellant material prevents adhesion of resin to the sidewall of the dispenser needle. Even when the circuit modules are successively fabricated, the dispenser needle stably supplies the resin.

The above and other elements, characteristics, features, steps and advantages of the present invention will become clear from the following description of preferred embodiments taken in conjunction with the accompanying drawings.

DETAILED DESCRIPTION OF PREFERRED EMBODIMENTS

Figure 1A:
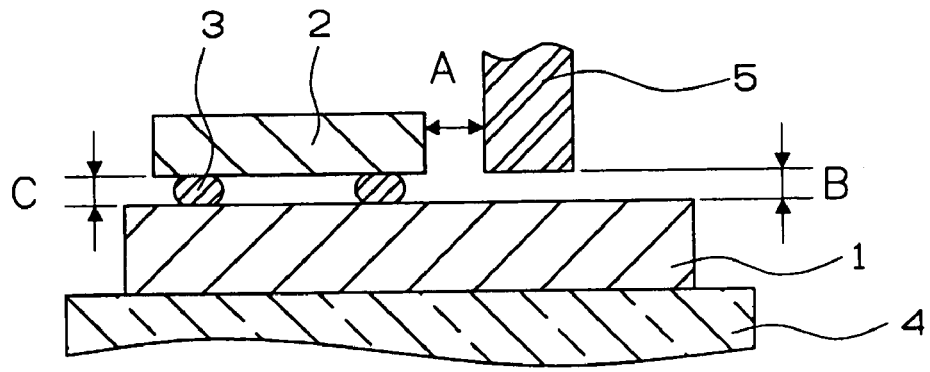
FIGS. 1A to 1D are cross-sectional views showing each step of a method for fabricating a circuit module according to preferred embodiments of the present invention.

With reference to the drawings, preferred embodiments of the present invention will now be described. Referring to FIG. 1A, a chip component 2 is mounted on a substrate 1 via electrodes 3, such as metal bumps, disposed therebetween in a flip chip configuration. The substrate 1 is placed on a pedestal 4 which has a built-in heat source (not shown) and a dispenser needle 5 is brought close to the substrate 1 at a predetermined distance therefrom. In this preferred embodiment, the distance A between the sidewall of the chip component 2 and the sidewall of the dispenser needle 5 is about 0.12 mm, the distance B between the tip of the dispenser needle 5 and the top surface of the substrate 1 is about 50 µm, and the distance C between the bottom surface of the chip component 2 and the top surface of the substrate 1 is about 40 µm.

Figure 1B:
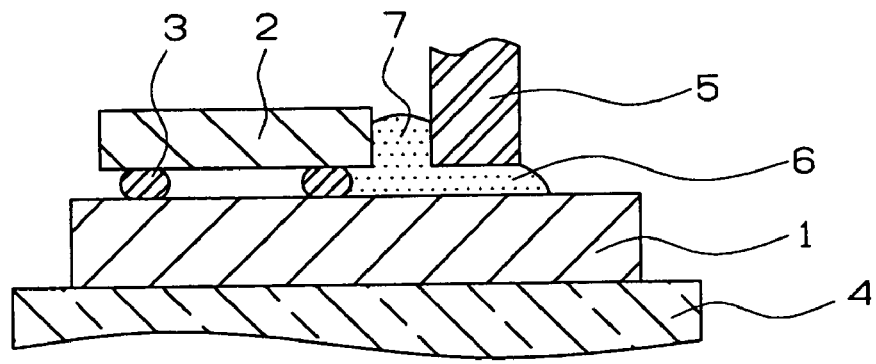

Referring to FIG. 1B, the pedestal 4 is heated to about 100° C. and the dispenser needle 5 supplies a desired amount of resin 6. A resin pool 7 is formed between the sidewall of the dispenser needle 5 and the sidewall of the chip component 2 due to capillary action. The resin 6 is preferably primarily composed of epoxy resin and preferably includes, for example, about 55 percent by weight of a filler. The viscosity of the resin 6 is, for example, preferably about 100 mPa·s at a temperature of about 100° C. Epoxy resins exhibit high electrical insulation, adhesiveness and heat resistance when they are cured. In this respect, epoxy resins are preferable as the resin 6 to fill the gap between the chip component 2 and the dispenser needle 5.

Figure 1C:
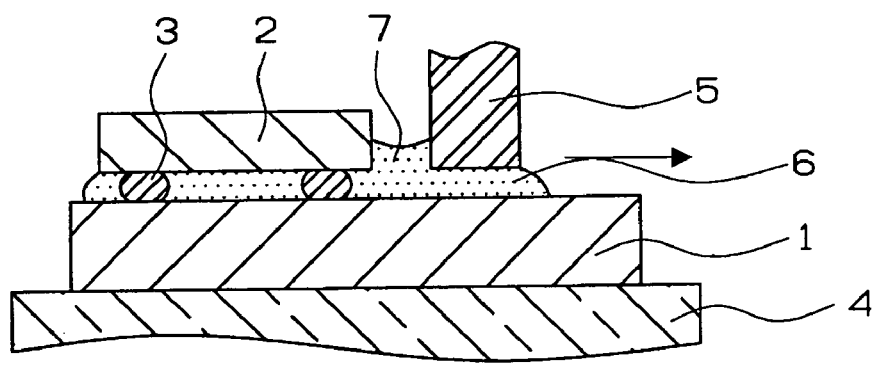
Figure 1D:
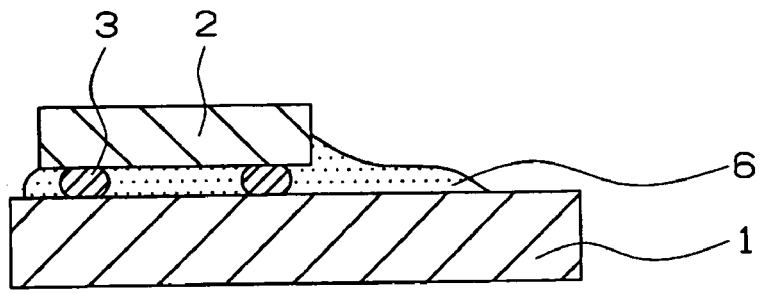
Figure 2A:
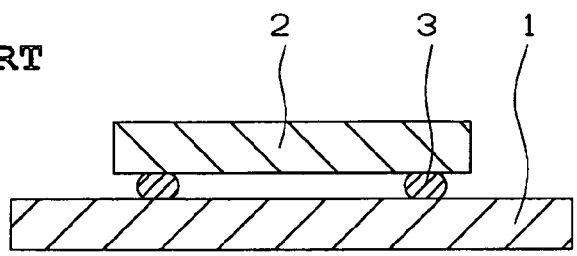
FIGS. 2A to 2D are cross-sectional views showing each step of a known method for fabricating a circuit module.
Figure 2B:
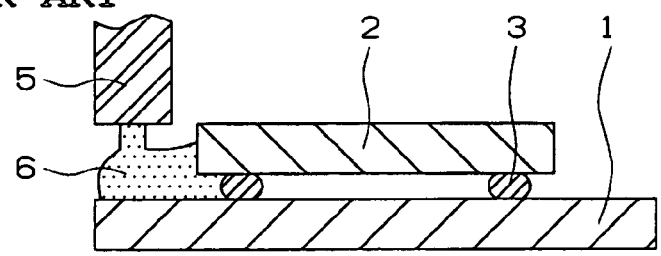
Figure 2C:
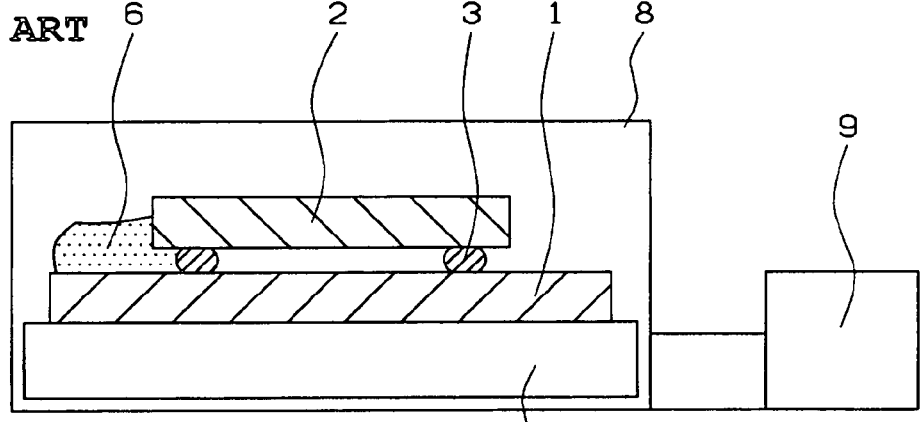
Figure 2D:
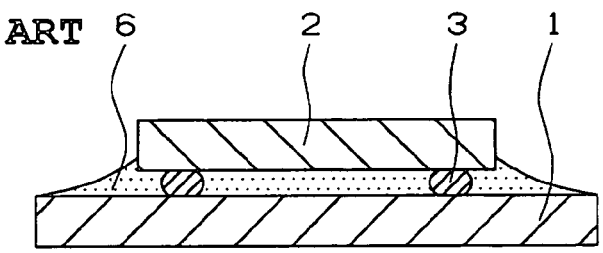

Referring to FIG. 1C, after the desired amount of the resin 6 is supplied by the dispenser needle 5, the resin 6 is left to stand. Due to capillary action, the gap between the chip component 2 and the substrate 1 is spontaneously filled with the resin of the resin pool 7. At this time, the dispenser needle 5 is maintained at a position shown in FIG. 1C, thereby minimizing the spread of the resin 6 beyond the dispenser needle 5 in the opposite direction away from the chip component 2 as indicated by the arrow in FIG. 1C.

If the resin pool 7 is not formed, the dispenser needle 5 must continue supplying the resin 6 at a desired rate until the gap between the chip component 2 and the substrate 1 is filled with the resin 6. Supplying resin in this manner is burdensome. By contrast, in preferred embodiments of the present invention, a desired amount of the resin 6 is supplied at one time to form the resin pool 7. After the resin pool 7 is formed and the dispenser needle 5 stops supplying the resin 6, the gap between the chip component 2 and the substrate 1 is spontaneously filled with the resin 6 of the resin pool 7 due to capillary action, thereby greatly simplifying the manufacturing process.

After the gap between the chip component 2 and the substrate 1 is filled with the resin 6, the circuit module is preferably heated at a temperature of about 150° C. for about 60 minutes in an oven to cure the resin 6. This completes the filling process with the resin 6. Thereafter, if necessary, other electronic components may be mounted on the substrate 1, thereby completing the circuit module of a preferred embodiment of the present invention.

Under the aforementioned conditions using the resin 6, the formation of the resin pool 7 was observed by experiments at various distances A, i.e., 0.2 mm, 0.15 mm, 0.12 mm, and 0.1 mm. At the distances A of about 0.2 mm and about 0.15 mm, the resin pool 7 was not formed, whereas at the distances A of about 0.12 mm and about 0.1 mm, the resin pool 7 was formed. Accordingly, the distance A between the sidewall of the chip component 2 and the sidewall of the dispenser needle 5 is preferably less than about 0.15 mm.

The distance B between the tip of the dispenser needle 5 and the top surface of the substrate 1 is preferably in the range of about 20 µm (0.02 mm) to about 100 µm (0.1 mm). If the distance B exceeds this range, it is difficult to form the resin pool 7 and the resin tends to extend upward along the chip component 2. Furthermore, the resin of the resin pool 7 tends to spread beyond the dispenser needle 5 in the opposite direction away from the dispenser needle 2, and thus, the undesired spread of the resin is likely to occur. If the distance B is less than the range, the dispenser needle 5 is more likely to come into contact with the substrate 1 due to the general positional accuracy of the dispenser needle 5.

The preferred ranges for the distances A and B according to preferred embodiments of the present invention are not limited to those described above and may be changed depending on, for example, the viscosity of the resin 6, and the gap between the chip component 2 and the substrate 1.

Preferably, the sidewall of the dispenser needle 5 is coated with a highly water-repellent material. When the resin 6 sticks to the sidewall of the dispenser needle 5 during successive fabrication of the aforementioned circuit module, the amount of the resin supplied from the dispenser needle 5 may vary. To solve this problem, preferably the sidewall of the dispenser needle 5 is coated with a highly water-repellent material, thereby preventing the resin from sticking to the sidewall of the dispenser needle 5. The highly water-repellent material may be polytetrafluoroethylene, or other suitable materials.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A method for fabricating a circuit module comprising the steps of:
   supplying a resin from a dispenser needle disposed at a supplying position onto a substrate on which a chip component is mounted in a flip chip configuration so as to form a resin pool between a sidewall of the chip component and a sidewall of the dispenser needle; and
   filling substantially an entire gap between the chip component and the substrate with the resin of the resin pool while the dispenser needle is disposed at the supplying position.

2. A method for fabricating a circuit module according to claim 1, wherein the rate at which the resin pool is formed between the sidewall of the chip component and the sidewall of the dispenser needle due to capillary action is greater than the rate at which the gap between the chip component and the substrate is filled with the resin.

3. A method for fabricating a circuit module according to claim 1, wherein, in the step of filling the gap between the chip component and the substrate with the resin of the resin pool, the dispenser needle is fixed at a position until the gap is filled with the resin of the resin pool.

4. A method for fabricating a circuit module according to claim 1, wherein, in forming the resin pool, the distance between the sidewall of the chip component and the sidewall of the dispenser needle is less than about 0.15 mm.

5. A method for fabricating a circuit module according to claim 1, wherein the chip component is a bare chip.

6. A method for fabricating a circuit module according to claim 1, wherein the circuit module includes a radio frequency circuit.

7. A method for fabricating a circuit module according to claim 1, wherein the resin is an epoxy resin.

8. A method for fabricating a circuit module according to claim 1, wherein the sidewall of the dispenser needle is coated with a water repellant material.

9. A method for fabricating a circuit module according to claim 1, wherein, in forming the resin pool, the distance between a tip of the dispenser needle and a top surface of the substrate is about 50 μm.

10. A method for fabricating a circuit module according to claim 1, wherein, in forming the resin pool, the distance between a bottom surface of the chip component and a top surface of the substrate is about 40 μm.

11. A method for fabricating a circuit module comprising the steps of:
    placing a substrate on a pedestal having a built-in heat source to heat the substrate, the substrate including a chip component that is mounted thereon in a flip chip configuration;
    supplying a resin onto the substrate by a dispenser needle disposed at a supplying position to form a resin pool between a sidewall of the chip component and a sidewall of the dispenser needle; and
    filling substantially an entire gap between the chip component and the substrate with the resin of the resin pool while the dispenser needle is disposed at the supplying position.

12. A method for fabricating a circuit module according to claim 11, wherein the rate at which the resin pool is formed between the sidewall of the chip component and the sidewall of the dispenser needle due to capillary action is greater than the rate at which the gap between the chip component and the substrate is filled with the resin.

13. A method for fabricating a circuit module according to claim 11, wherein, in the step of filling the gap between the chip component and the substrate with the resin of the resin pool, the dispenser needle is fixed at a position until the gap is filled with the resin constituting the resin pool.

14. A method for fabricating a circuit module according to claim 11, wherein, in forming the resin pool, the distance between the sidewall of the chip component and the sidewall of the dispenser needle is less than about 0.15 mm.

15. A method for fabricating a circuit module according to claim 11, wherein the chip component is a bare chip.

16. A method for fabricating a circuit module according to claim 11, wherein the circuit module includes a radio frequency circuit.

17. A method for fabricating a circuit module according to claim 11, wherein the resin is an epoxy resin.

18. A method for fabricating a circuit module according to claim 11, wherein the sidewall of the dispenser needle is coated with a water repellant material.

19. A method for fabricating a circuit module according to claim 11, wherein, in forming the resin pool, the distance between a tip of the dispenser needle and a top surface of the substrate is about 50 μm.

20. A method for fabricating a circuit module according to claim 11, wherein, in forming the resin pool, the distance between a bottom surface of the chip component and a top surface of the substrate is about 40 μm.

* * * * *